United States Patent [19]

Bond et al.

[11] Patent Number: 4,759,675
[45] Date of Patent: Jul. 26, 1988

[54] CHIP SELECTION IN AUTOMATIC ASSEMBLY OF INTEGRATED CIRCUIT

[75] Inventors: Robert H. Bond, Carrollton; Steven Swendrowski, The Colony; Michael A. Olla, Flower Mound; Barry L. Morrison, Bedford; Ricky Parkinson, Lewisville; Linn Garrison, Garland; John D. Pace, Irving, all of Tex.

[73] Assignee: SGS-Thomson Microelectronics, Inc., Carrollton, Tex.

[21] Appl. No.: 923,315

[22] Filed: Oct. 27, 1986

Related U.S. Application Data

[62] Division of Ser. No. 592,156, Mar. 22, 1984, Pat. No. 4,627,787.

[51] Int. Cl.⁴ .............................................. B65G 65/00
[52] U.S. Cl. .................................... 414/222; 414/417
[58] Field of Search ...................... 414/417, 222, 786; 29/740, 711, 832

[56] References Cited

U.S. PATENT DOCUMENTS

| | | | |
|---|---|---|---|
| 3,785,507 | 1/1974 | Wiesler et al. | 414/417 X |
| 4,476,626 | 10/1984 | Gumbert et al. | 29/759 X |
| 4,526,646 | 7/1985 | Suzuki et al. | 29/740 X |

Primary Examiner—Robert J. Spar
Assistant Examiner—Donald W. Underwood
Attorney, Agent, or Firm—Roland Plottel

[57] ABSTRACT

An apparatus for removing selected integrated circuit dice from a wafer array of dice sequentially moves a striker above a tape to the underside of which the array is mounted and then knocks a die down from the array of dice into a receptacle for transport to further processing stages.

5 Claims, 15 Drawing Sheets

CHIP SELECTION IN AUTOMATIC ASSEMBLY OF INTEGRATED CIRCUIT

This application is a division, of application Ser. No. 592,156, filed 3/22/84, now U.S. Pat. No. 4,627,787.

TECHNICAL FIELD

The field of the invention is that of removing selected integrated circuit chips from an array of chips.

BACKGROUND ART

The assembly operation for integrated circuits, sometimes referred to as the "back-end", consists of taking a silicon wafer containing several dozen or more integrated circuit chips; testing, sometimes referred to as "probing", the chips to determine which are working and which are not; cutting the wafer apart to produce individual chips; attaching the chip to a leadframe; bonding wires to the leads one at a time; and encapsulating the combination in plastic to provide protection for the device and cutting and forming the external leads of the leadframe to their final shape.

The standard method of attaching wires to the chip is by wire bonding, in which a gold or aluminum alloy wire is pressed very hard (in the presence of elevated temperatures and/or ultrasonic energy) against a pad on the chip until a bond is formed. One wire is done at a time. This method uses a great deal of labor and expensive materials. Automated wire bonding machines are known, but they have an inherent limitation. Even with the most rapid machines that can be imagined, there are factors that provide a necessary limitation to approximately 2,000 units per hour for a 16 pin chip. With wire bonding techniques, it is also necessary to attach the chip to the package or leadframe in order to maintain it in position while the wire bonds are formed. Also, the leads in this process must be typically made of an expensive expansion-controlled alloy in order to have the correct thermal expansion matching between the chip and the leads when gold-silicon eutectic die bonding is used or expensive special alloys or adhesives must be used to correct the thermal mismatch. Also, the leads must be plated with gold, silver or other precious metal so that the bonding wire can form a reliable connection to the lead.

One prior art method that provides for simultaneous lead soldering is the "flip-chip" method developed by IBM, in which a lump of solder is placed on the chip and the chip is soldered to a ceramic substrate that is attached to the leads. This IBM method does not have a layer of leads on the top of the chip.

DISCLOSURE OF INVENTION

The invention relates to an automated method of assembling and encapsulating integrated circuit chips in which the chips are selectively removed from an integrated circuit wafer by pressing against a selected chip to knock it out of the wafer array into a receptacle.

A feature of the invention is an automatic method of removing chips selectively from a wafer using stored data to locate good chips.

Another feature of the invention is the elimination of the step of breaking apart the individual dies from the wafer.

Yet another feature of the invention is the elimination of an intermediate step of bonding a die to a support before lead attachment.

BEST MODE FOR CARRYING OUT THE INVENTION

In any integrated circuit assembly operation, there is an intermediate series of steps in which good dice are removed from the dice array on a wafer that has been processed and probe-tested. The dice are then placed together with a set of leads in preparation for the bonding process. In the prior art, the dice are scribed and broken apart and the loose dice are picked up manually and moved to a bonding machine.

The subject invention is a method of automatically removing good dice under control of a computer referring to stored test data and placing the dice in a holding fixture for direct attachment of leads.

The present invention was developed together with other components of a system for assembling and testing integrated circuits. Other features of the system are the subject of co-pending patent applications, filed the same day herewith and assigned to the assignee hereof. In order to convey the invention in context, discussion of the overall system is included in this specification.

Figure 1:
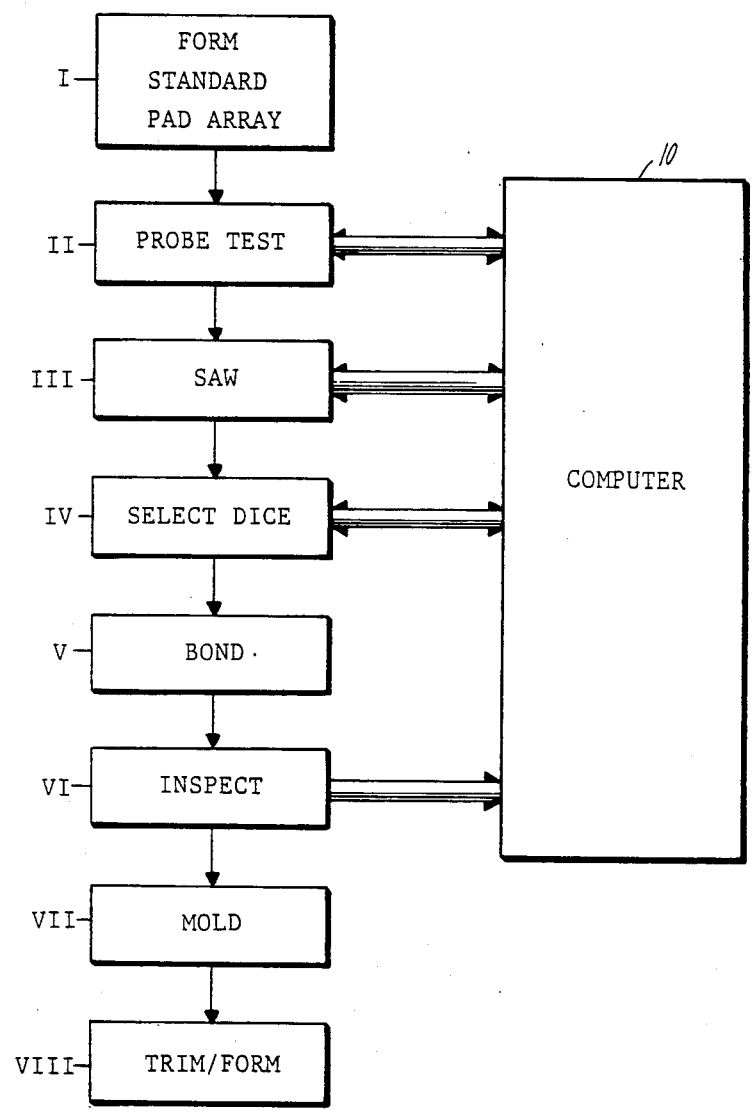
FIG. 1 illustrates the process flow in the subject invention.

An overall flow chart of the steps used in the back-end assembly is illustrated in FIG. 1, in which a number of steps are illustrated schematically and are performed by a variety of different machines in communication with and sometimes controlled by a computer for storing test and other data.

In the first major step, represented by the box labelled I, a process that may be part of the "front-end" or the "back-end", accepts as input a wafer that has been completed with all the conventional steps (including passivation—etc.) and applies a further layer of dielectric having a thickness sufficient to protect the chip circuits and to insulate them electrically from signals being carried on the top surface of the dielectric.

A pattern of metal leads is formed that extends from the contact pads on the previous chip to a standard array of contact pads on the top of the dielectric. The standard array is the same for all chips having the same number of pins, regardless of the size of the chip die.

The wafer is then probe tested, in major step II with the results of the probe test being stored electrically, such as in a computer. The conventional ink-dot marking system for bad chips is not used.

The wafer is then adhesively mounted on an adhesive film in a frame holder that is shaped to allow for automatic insertion and orientation in various fixtures further along in the process and cut apart in an automatic sawing process (Step III) that cuts through the entire thickness of the wafer.

The good dice are then removed from the wafer in an automatic sequence (Step IV) that presses from above against the tape to selectively pick a die down into a dedicated carrier where it rests circuit side down. This is not a problem since the active circuitry is protected by the standard pad dielectric and standard pads. The wafer and push-out device are moved under computer control to put the dice into the correct positions in the carrier.

The dice are transferred to a mating carrier simultaneously in an inversion operation that rotates the two-carrier "sandwich" by 180 degrees, so that the dice resting in the second carrier have contacts on the top side. A set of dice are transferred to a bonding fixture that holds a convenient number, illustratively 14 dice. Once loading is complete, a leadframe matching the spacing of the dice in the fixture is positioned above the dice in the soldering fixture and an upper bonding fixture is added to maintain lead to pad contact during the bonding process.

The bonding fixture is heated to reflow the solder and form the interconnection (Step V).

The leadframe with dice attached is placed in a transfer or injection molding machine that encapsulates the die together with the interconnections to the leadframe (Step VI).

The molded strip of devices is then trimmed and formed conventionally (Step VII).

There is a representation in FIG. 1 of data communication between the machines that perform the steps listed above and the controlling computer. Most data communication steps are optional. The step may indeed be performed under operator control and data may be written down manually. The benefits of automatic recording of data and error-free recall of data from a previous step will be evident to those skilled in the art.

The different steps of the invention are set forth in more detail below and in copending patent applications filed on the same date herewith and assigned to the assignee hereof.

Figure 2:
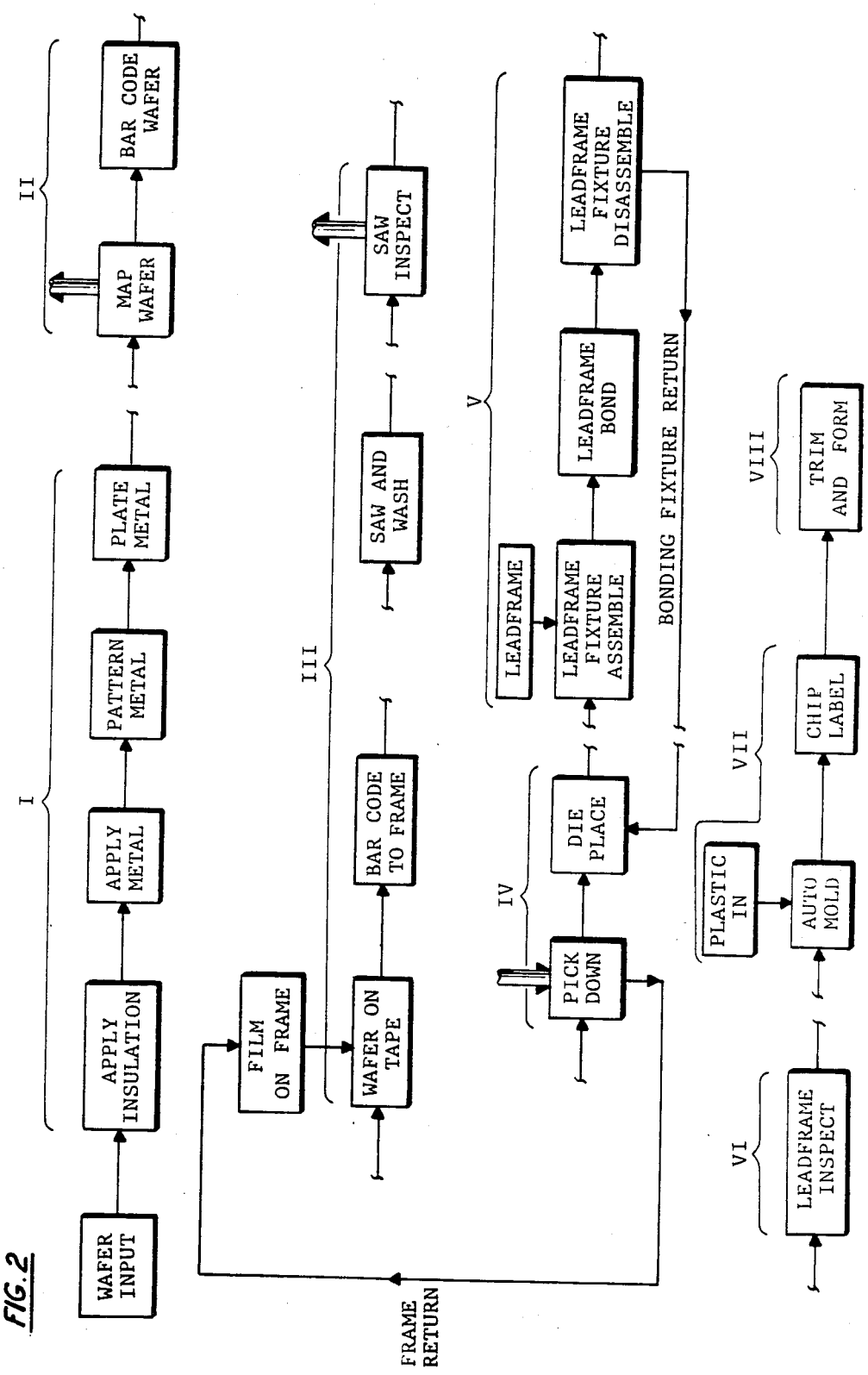
FIG. 2 illustrates the steps in FIG. 1 in more detail.

FIG. 2 sets out the steps in FIG. 1 in more detail and also illustrates the material and data flow. A convention used in this figure is that a broken line indicates a material transport step of the sort of loading the material into a container and moving the container to another location and a double arrow indicates data flow into or out of a computer or other storage device. The three material inputs to the process are the wafers, leadframes and plastic for encapsulation. Two recirculation loops involve, respectively, a frame used to support the wafers during the sawing and die selection steps and a positioning fixture used to maintain a set of dice in alignment with a leadframe segment during the bonding operation.

Standard Contact Pads

Returning to the first major step, the illustrative dielectric layer is a polyimide such as Dupont 2525 applied with the thickness of 6 microns and cured at a temperature of greater than 260 C. There may be a nitride or other layer below the polyimide to improve adhesion to the reflow glass or other top layer. The electrical contact pads that have been previously formed in the integrated circuit chip by conventional processing techniques are exposed by applying a photoresist, either liquid or in the form of a tape, on top of the dielectric and etching down through it a passageway to the metal contact pad in the circuit in a conventional manner. A "via" will be formed by filling the contact holes with a metal or other conductor until the surface of the dielectric is reached. The photoresist is stripped off and a layer of metal is applied by any technique, such as sputtering, over the surface of the polyimide. In one example, the polyimide was back sputtered to prepare the surface, after which 600 Angstroms of 10% titanium +90% tungsten followed by 1000 Angstroms of copper and titanium sputtered simultaneously, followed by typically 3 microns of copper were sputtered on. A second layer of photoresist is applied and patterned to define a set of metal leads in the metal layer. The leads reach from the vias penetrating the dielectric to an area in the center of the chip which has a standard pad array of pad contacts that is the same for all the chips that have the same number of leads. For example, a 16 pin chip will have the same standard pad array, of size about 0.016" by 0.016" in a standard configuration having dimensions of 0.126" by 0.126", whether it is a memory or any other logic device. The standard pad array will be sized so that it fits on the smallest chip that is to be used with that leadframe. Optional versions of the invention employ a pad array that is arranged for some particular purpose.

The exposed areas of the metal are plated with a solder composed of a standard mixture of lead and tin in a conventional electrolytic plating process that employs a mixture of 95% tin and 5% lead. The photoresist is stripped and the plated areas of the metal layer are used as an etching mask in the next step in which the remaining unwanted area of the metal layer is etched away in a bath of hydrogen peroxide plus ammonium hydroxide followed by hydrogen peroxide, which does not attack the solder.

Figure 3A:
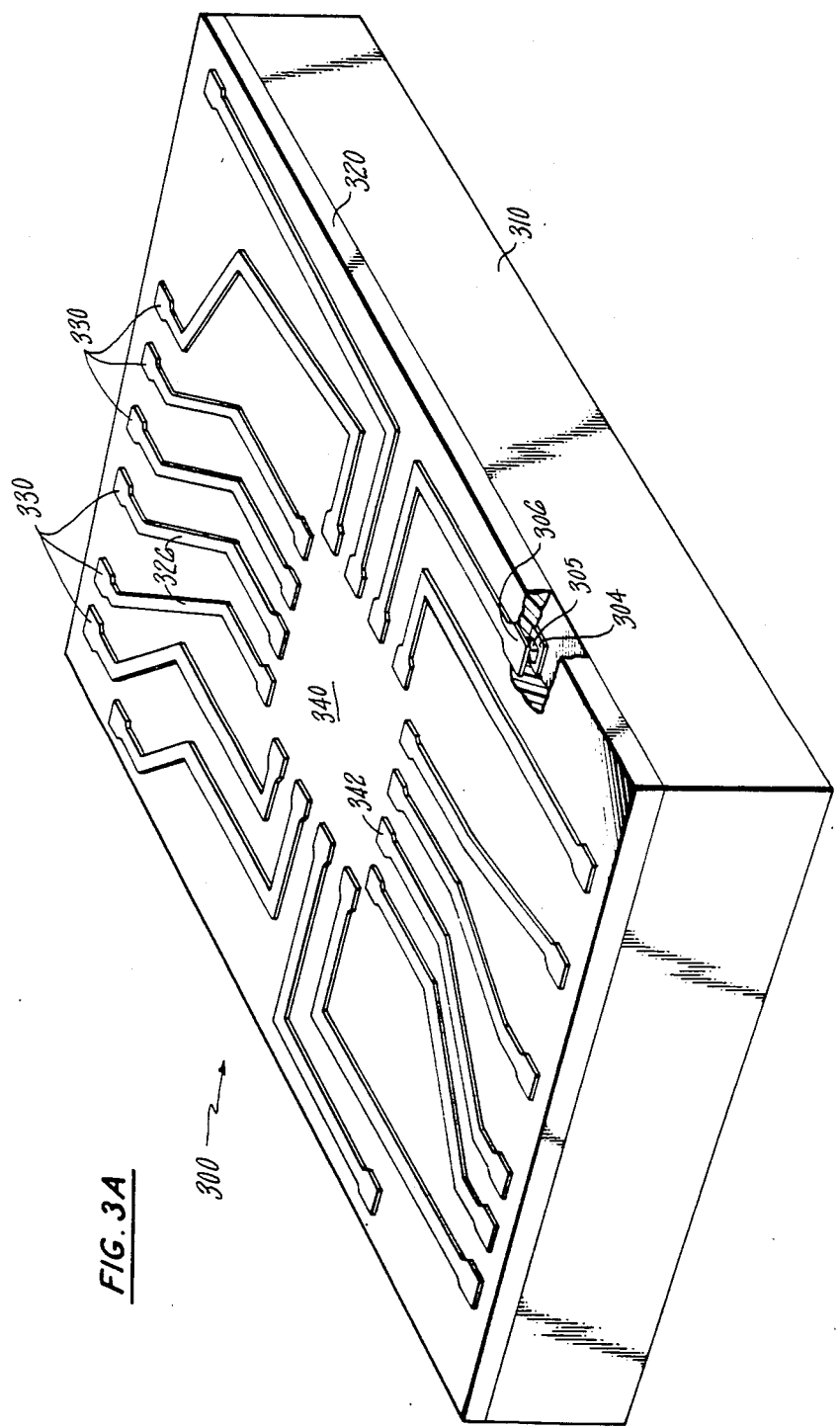
FIGS. 3A and 3B illustrate different forms of a chip used in the subject invention.

There now remains a chip 300 of the form illustrated in FIG. 3A, in which die 310 has on it a thick layer of polyimide 320 and a network of metal lines 326 leading from the contact areas 330 on the outside of the chip to the standard pad array 340. The metal lines 326 have lower inductance greater thermal conductivity and greater strength compared to the wires that were previously used.

In the example shown in FIG. 3A, the first contacts and the vias through the polyimide layer are all formed on the perimeter of the chip. This figure illustrates a chip in which the layout design was made for the old wire-bonding method in which the contact areas had to be on the perimeter of the chip. An advantage of retaining the old design, besides saving the expense of a new layout, is that it is possible to use conventional wire-bonding processes when added capacity is required. To do this however, requires that the additional dielectric and metallizations for the standard pad process is not used.

Figure 3B:
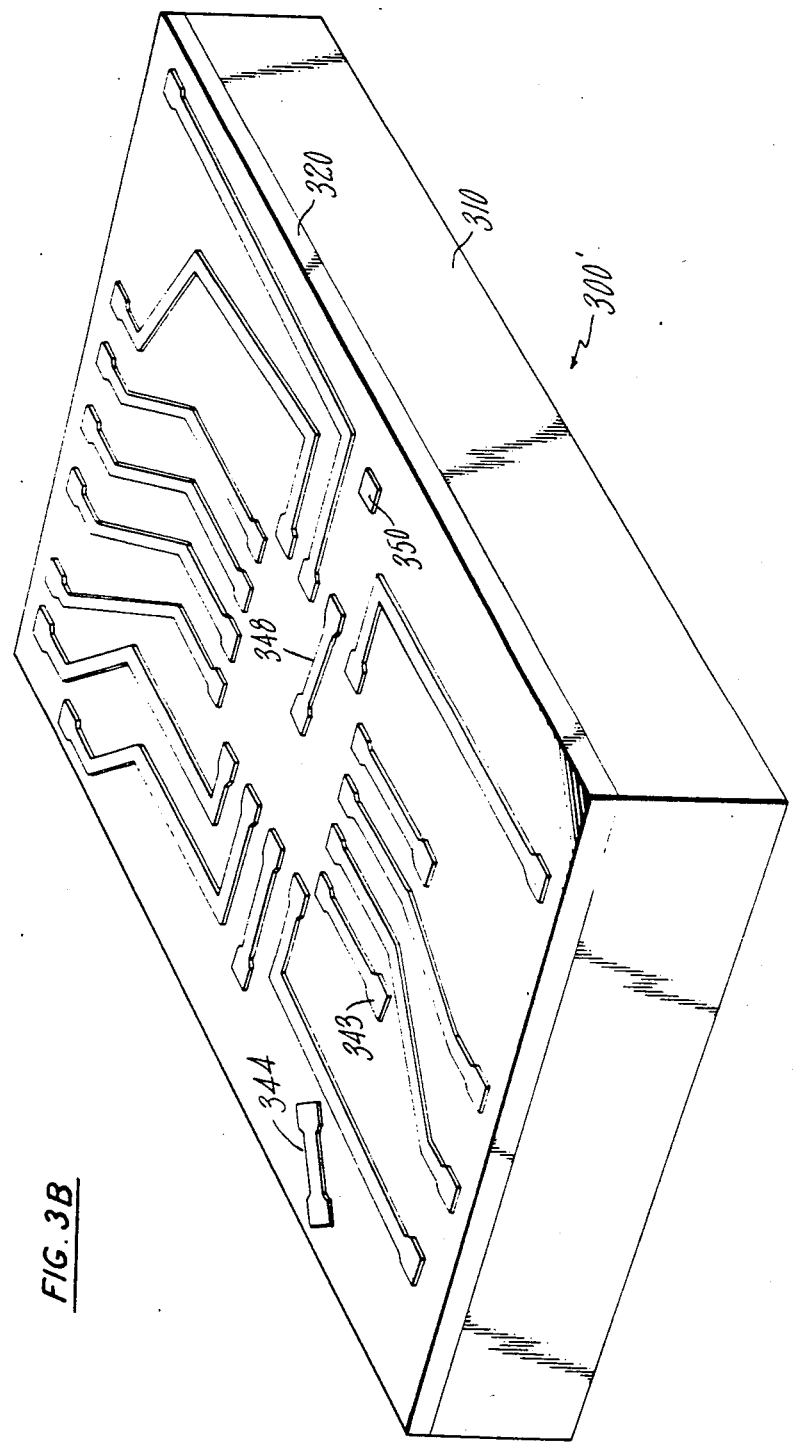

It is also possible to use the invention and put the contact areas through the dielectric at any convenient location, as shown in FIG. 3B. The vias for these leads are shown as originating at different locations on the chip surface, not exclusively at the edge as was the case in the prior art. Lead 348 is shown as connecting a via that is located within the standard pad array. Lead 343 is connected to a via-section 344 through a bridge, not shown in the drawing, that is placed on top of the passivation layer of the underlying chip below the polyimide. This illustrates an additional degree of freedom in routing leads and placing components that is provided by the invention.

A via 305 is shown in FIG. 3A in a cut-away portion of the figure as extending from a lower contact area 304 to an upper contact 306 at an end of one of leads 326. The lower contact pads in current practice are typically 4 mils by 4 mils. With such a large area to make contact, the alignment tolerance for the formation and location of the vias and the placement of leads 326 are typically ±2 mils to 3 mils, which is much greater than a typical tolerance of ±½ mil to 1 mil for connecting leads in the precision processes that are used with conventional wirebonding.

The steps of forming vias and putting down leads may be performed in the front-end using the standard machines for photolithography, if that is convenient. Since the requirements for putting down these metal leads are much less stringent in position alignment than the usual front-end work, it may be preferable to use thick-film technology, such as screen printing, to pattern the dielectric and top leads. Typically, the thick-film technique will be ¼ to ½ the cost of the precision techniques.

Saw

Figure 4:
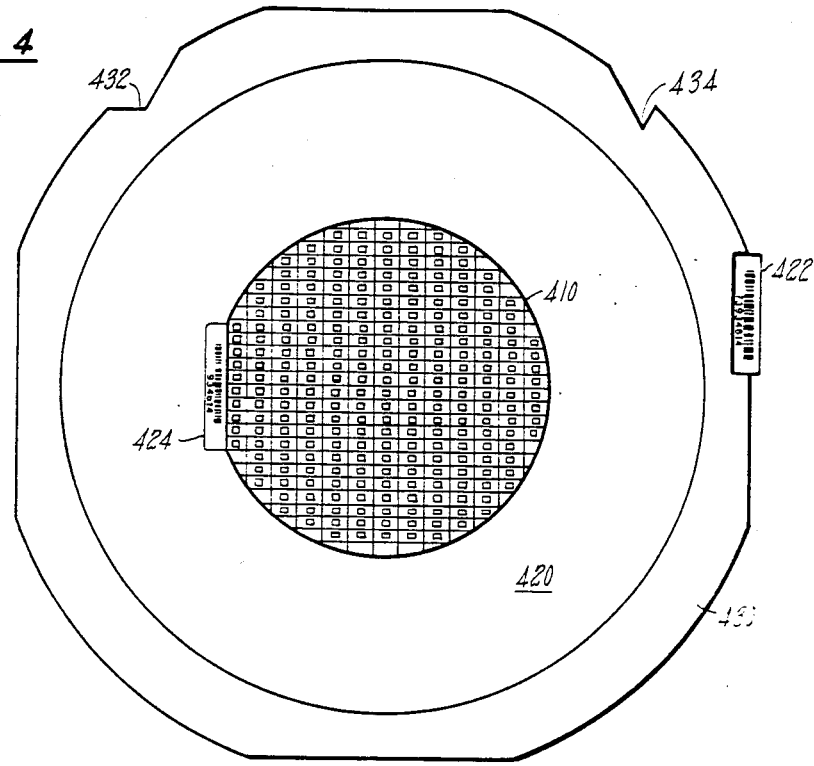
FIG. 4 illustrates a wafer mounted on tape.

In the next major stage of the process (Step III), the wafers are accurately mounted in a fixture and the dice are cut apart. Referring now to FIG. 4, wafer 410 is accurately mounted on an adhesive tape 420 that has been stretched over a frame 430. Since the dice on a wafer are positioned in a rectangular array, a simple reference system that is all that is necessary is a pair of detents 432 and 434 that define a reference direction. The wafer is positioned so that a reference point 411 on the wafer is positioned with a known relation to detent 432, say, in a coordinate system aligned with respect to the detents. The point in the sequence for establishing the coordinate system is also optional. At this time, an identifying label on the frame is correlated with the identifying number on the wafer. This may be done by applying a new label to the frame that matches the wafer label; or by reading a permanent label on the frame.

A conventional automatic saw cuts entirely through wafer 410 along the "streets" that separate the dice. This is in contrast to the prior art, in which the wafer is cut partially through ("scribed") and the dice are broken apart. In a method according to the invention, the dice remain in their positions during the separation process, in contrast to the prior art, in which the identity of the dice is typically lost when they are broken apart and processed. Since the identity of the dice is preserved, it is possible with this invention to track an individual die through the manufacturing process.

In an optional method, the saw has the ability to detect damage done to chips during the sawing process and the test data stored in the computer can be updated to identify damaged chips. A saw with the optional damage-identification feature is a K&S Model 797. The wafers are conventionally cleaned by cleaning equipment that is integral with the saw system.

Select Dice

Figure 7A:
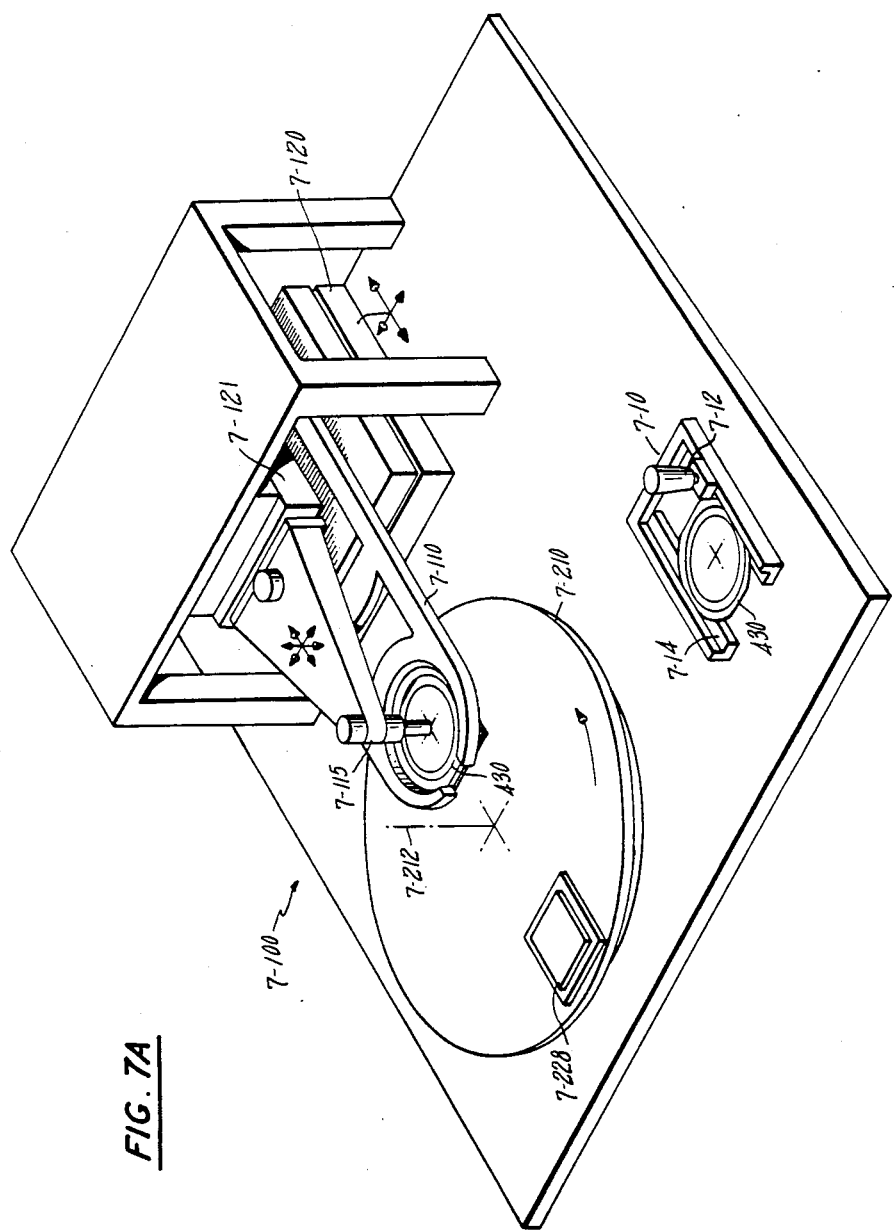
FIGS. 7A-7C illustrate a layout for a machine used for pick-down die selection from a sawn wafer into a die storage carrier.

Referring now to FIG. 7A, there is illustrated an apparatus used to implement the sorting process of picking out the good dice or dice with desired performance levels. More detail of the process steps is shown in FIG. 2, which shows steps that are part of major steps III, IV and V. Referring now to FIG. 2, an optional inspection step that may be considered part of major step III or IV inspects the sawn wafer and updates the "wafer map" if any dice have been damaged in the sawing process. The device is commercially available and is part of the saw work station. The washed wafers are then transferred to a work station to be described below, where the wafer identifying label is read, then to the picking station where the stored data is related to the aligned wafer. An optional inspection step that may be considered part of major step III or IV inspects the sawn wafer and updates the "wafer map" if any dice have been damaged in the sawing process. The device is commercially available.

The die selection process is discussed in more detail in connection with FIG. 6. During this sequence, tape frames are cycled in a recirculation loop, indicated by a reverse line in FIG. 2. When the supply of usable dice from a wafer is exhausted, the frame is moved to a station where the old tape and scrap dice are removed and the empty frames are brought back to the input station.

Referring now to FIG. 7A, a rotary indexer 7-210, illustratively rotating under computer control, holds a set of die holders, two of which are shown as 7-220 and 7-228. A convention used in this specification is that the first number of a hyphenated reference numeral refers to the figure in which the item is introduced or explained in most detail. Each die holder (referred to as a "waffle pack" because of its appearance) receives dice into a rectangular array of receptacles as they fall away from a wafer 410 in a process that is described more fully below.

When a waffle pack is filled, indexer 210 rotates an empty pack into position. The full pack is rotated into an unloading position and passed to an inversion station where a matching waffle pack is aligned on top of the dice and the waffle pack plus dice "sandwich" is inverted so that the dice are resting with the contact side upwards ready to be placed in a bonding fixture. This inversion step may be performed manually or automatically. Optional forms of inversion are described below.

A tape frame is first identified in bar code reader station 7-10 in FIG. 7A, in a sequence (6-114 in FIG. 6) in which tape frame 430 rests on shelves 7-14 and either the frame is moved or reader 7-12 is slid over the label. A conventional bar code reading system reads the code and transmits it to the computer, where the data from the test results are fetched from memory (steps 6-200) to guide the die-selection process.

Figure 7B:
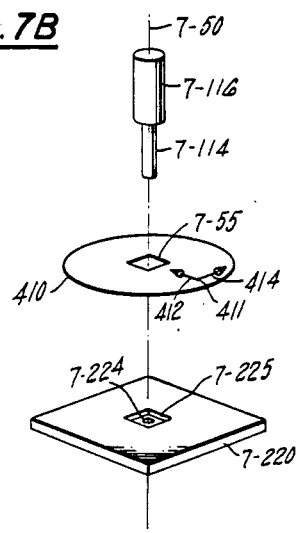

Further details of the selection process and apparatus are illustrated in FIG. 7B, in which axis 7-50 passes through assembly 7-115 comprising energizer 7-116 and striker 7-114 above die 7-55 which is part of wafer 410. Wafer 410, as described above in the discussion of FIG. 4, adheres to tape 420 held in frame 430, which is mounted with wafer 410 on the lower side. Die 7-55 is the next die to be removed from the die array that was formed on wafer 410. Frame 430 is supported by holder 7-110 and positioned at axis 7-50 by X-Y drive 7-120, shown in schematic form in FIG. 7A, as it is a conventional device (Kulicke & Soffa Model 350-103). Frame 430 is aligned in position, as described in the discussion of FIG. 4, by the matching of detents 432 and 434 with pins in holder 7-110. Unnecessary details of the apparatus have been omitted in order to show the essential relationship with the greatest clarity.

Below die 7-55, receptacle 7-225, formed in holder 7-220 awaits the die. Holder 7-220 is one of two or more holders (7-220, and 7-228) resting on plate 7-210.

Figure 7C:
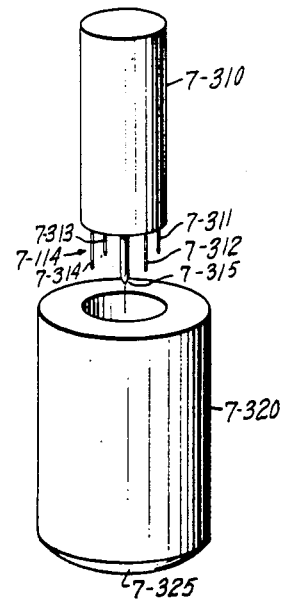

In operation, the striking assembly 7-115 presses striker 7-114 against the top of tape 420, deflecting it downward by approximately one quarter inch. X-Y drive 7-121 slides striker 7-114 over the tape to the correct position. The pick-down operation is effected by air valve 7-116 (one version of the energizer) which is energized to drive striker 7-114 downwards, striking tape 420 at a point above die 7-55. Die 7-55 is gently pushed from the adhesive tape and falls into receptacle 7-225. Pin assembly 7-114 penetrates tape 420 with a set of needles shown in FIG. 7C. Four needles, 7-311, to 7-314 are rigidly attached to shaft 7-310. A fifth needle 7-315 extends 0.050 inch below the others and is spring-loaded with a force of three ounces.

Illustratively, assembly 7-114 is projected downward by a conventional two-way air valve 7-116 with a force of one pound, the air pressure being on for a period of about 20 milliseconds. Needle assembly 7-114 is retracted when its travel has triggered an optical limit switch that is set so that the tips of needles 7-311 to 7-314 project about ⅛ inch below lower surface 7-325 of holder 7-320. Lower surface 7-325 has a radius of curvature of two inches to avoid excessive stress on the dice.

An important function of needle 7-315 is to suppress bouncing of the die. The die falls a nominal distance of 3/16 inch to receptacle 7-225. It may bounce partially out of the receptacle in extreme cases; it may lie against a side; or it may be chipped by impact with the bottom or sides of the receptacle. The spring on needle 7-315 absorbs the kinetic energy of the die, so that it quickly comes to rest with the minimum number of impacts.

Assembly 7-114 may advantageously be fitted with a conventional quick release mounting to facilitate rapid change from one assembly having a needle spacing suited for a large die to another assembly having a different spacing for a different die. Receptacle 7-225 in FIG. 7B is shown in the figure as a recessed rectangle, but other forms will be evident to those skilled in the art. A slight vacuum can be used to maintain the die in the interior of holder 7-220, communicating with the interior of receptacle 7-225 through hole 7-224 in FIG. 7B, so that die 7-55 is further prevented from bouncing out of alignment. The vacuum within holder 7-220 is maintained by forming a wiping seal at the lower surface of plate 7-210. As the plate rotates, an aperture in plate 7-210 comes to rest over a fixed vacuum line that is not shown in the drawing. The aperture establishes communication between the interior of holder 7-220 and the vacuum.

When holder 7-220 is full, or when a different performance level of die is to be selected, the drive within plate 7-210 rotates plate 7-210 to position the next holder. Holder 7-230 may be removed and passed to the next stage or remain stationary to accept additional dice of the same performance level, to be selected from a different wafer.

The assemblage of the two X-Y drives 7-120 and 7-121 and holders, indicated generally by the numeral 7-100, is a commercially available item from Design Components Inc., Medford, Massachusetts, Model Numbers DC44 and DC88, modified to hold the driving pin 7-115 and frame holder 7-110. The device 7-100 operates under the control of a computer, either the central computer indicated in FIG. 1 or a small local computer. The essential information that must be handled is the position of the current empty receptacle 7-225, the position of the next good die 7-55 relative to the coordinates centered at point 411 and the position of point 411 relative to holder 7-220. Axis 7-50 is, of course, centered on the receptacle 7-225 next to be filled and pin 7-115 and the next to be removed die are positioned accordingly.

Figure 6:
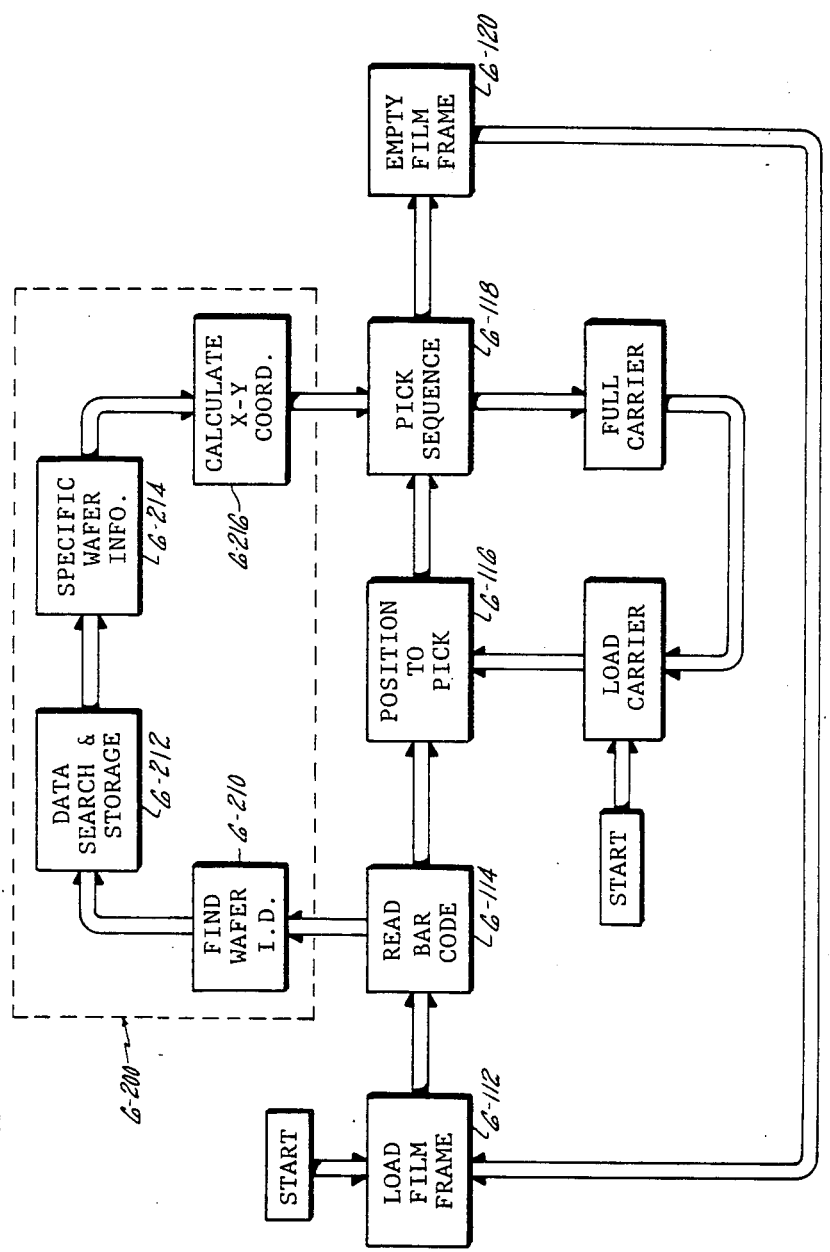
FIG. 6 illustrates a sequence of selecting the die from a sawn wafer.

The sequence to be followed in knocking out good dice is indicated in FIG. 6, in which a tape-frame is loaded manually or by robot (6-112) to start the process; the identifying bar code on the frame is read in step 6-114. The frame number is read and sent to a computer or stored in memory and compared against the data for the numbered or coded wafer. The exact X-Y position or wafer map for all good or selected die on the wafer is known and associated with the frame number allowing good die to be selected. The information stored in the computer is searched in sequence 6-200, in which the result at step 6-216 is the X-Y coordinate of the first (next) good die. A parallel sequence starts with loading an empty carrier 7-220 and rotating table 7-210 to position it close to device 7-100. The pick sequence, (sometimes referred to as "pick-down" in contrast to a conventional "pick-up") is represented in step 6-118.

The pick-down sequence is repeated until the first to occur of the depletion of the good dice that were on wafer 410 and are now in an aray on tape 420 and the filling of carrier 7-220. In either case, a new tape carrier or dice holder is substituted and the sequence is restarted. In an alternate sequence, only dice having certain criteria are selected in one pass and other good dice that are usable for a different application are left to be selected later.

While positioned in tape 420, the dice have their contacts facing down toward holder 7-220. It is necessary to invert the dice, so that when a die is placed in contact with a leadframe, the standard pads touch the leadframe; and this is done in the next step. The inversion may be manual, or may be carried out by machine, either singly or in groups.

As an alternative to the method described above, it may be preferable in some circumstances to knock the dice up instead of down. In that case, the wafer is on the upper side of the adhesive tape and the striking assembly is below. A complaint vacuum gripper is placed in contact with the selected die before the striking step and draws it away when the adhesive grip is released by the striking action. The die (contact side up) is immediately placed in the bonding fixture, with any necessary precising done as an intermediate step, either in a separate fixture or by means of tapered edges on the lower bonding fixture.

Single Inversion

Figure 8A:
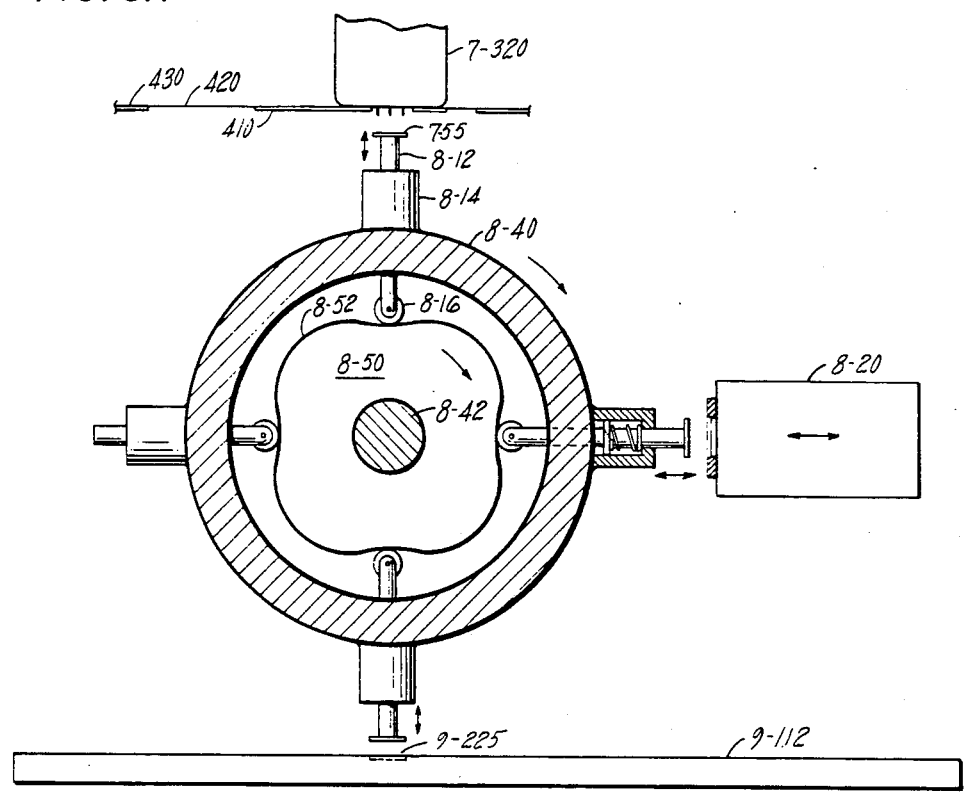
FIGS. 8A-8C illustrate an apparatus for an intermediate inversion step in the operating sequence of the apparatus used in FIG. 7.

An apparatus for performing the inversion step one die at a time is illustrated in FIG. 8A, in Which die 7-55 has been knocked off wafer 410 by needles 7-312 to 7-315 in head 7-320 as before. Instead of falling directly into receptacle 9-225 in holder 9-112, however, the die falls a short distance onto tube 8-12 extending upward from housing 8-14 supported by rotating cylinder 8-40. The die is held by vacuum action, the vacuum being maintained and switched by conventional means not shown in the drawing. Tube 8-12 moves up and down as indicated by the arrows in response to cams 8-52 on cam cylinder 8-50 rotating about axis 8-42, co-axial with cylinder 8-40. Cam cylinder 8-50 may rotate with cylinder 8-40 or rotate independently of it, under the control of conventional means not shown.

In operation, a new die is moved into position, nominally centered on tube 8-12, but actually somewhat misaligned because of error in the placement of wafer 410 on tape 420, as well as errors in aligning the supporting tape frame 430. Cam cylinder 8-50, rotates, bringing cam 8-52 into position under cam follower 8-16 and thus raising the tip of tube 8-12 into position to receive the die.

At the same time that the top tube 8-12 is receiving a die, the bottom tube 8-12 extends to deposit its die in receptacle 9-225.

Receptacle 9-225 will typically be only .002 inches greater in size than the die, in order to ensure accurate alignment of the leadframe with the die, so that the die will have to have its position corrected before it can enter. In FIG. 8A, this precising step is shown as being effected by preciser 8-20 which engages the die and, by conventional tapered surfaces, forces it into alignment. This precising step is performed at the same time as dice are deposited at the top and released at the bottom, so that no time is lost.

Figure 8B:
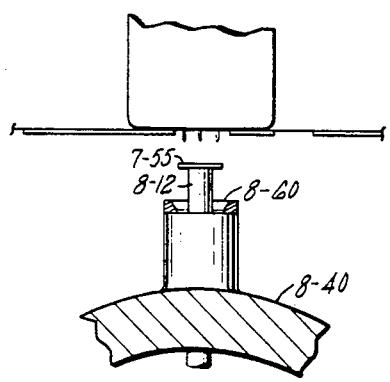

Those skilled in the art will recognize that a precising step may be performed at any of the three positions, or at more than one position. In particular, FIG. 8B shows a preciser 8-60 mounted on holder 8-14, so that the precising step is performed as tube 8-12 returns to a rest position. The vacuum may be turned off as tube 8-12 is lowered, in order to permit the die to slide into position more easily.

Yet another alternative is to have a preciser 8-60' mounted above receptacle 9-225. This preciser could be fixed in space and aligned with axis 8-42 of rotating cylinder 8-40; or it may be aligned with respect to fixture 9-112 (and removed before the leadframe is deposited).

Those skilled in the art will recognize that many alternative apparatus will be able to perform the inversion function. For example, cam cylinder 8-50 may be replaced by hydraulic cylinders, screw drives or any other means for advancing and retracting tubes 8-12. Further, if tape 420 and fixture 9-112 can be positioned with sufficient accuracy, then tubes 8-12 may be rigidly attached to cylinder 8-40, which will reduce alignment errors that result from tolerance in the position of tubes 8-12 relative to cylinder 5-40. In that case, any necessary vertical motion will be provided by holder 9-320 and/or holder 9-112.

Mass Inversion

Figure 11A:
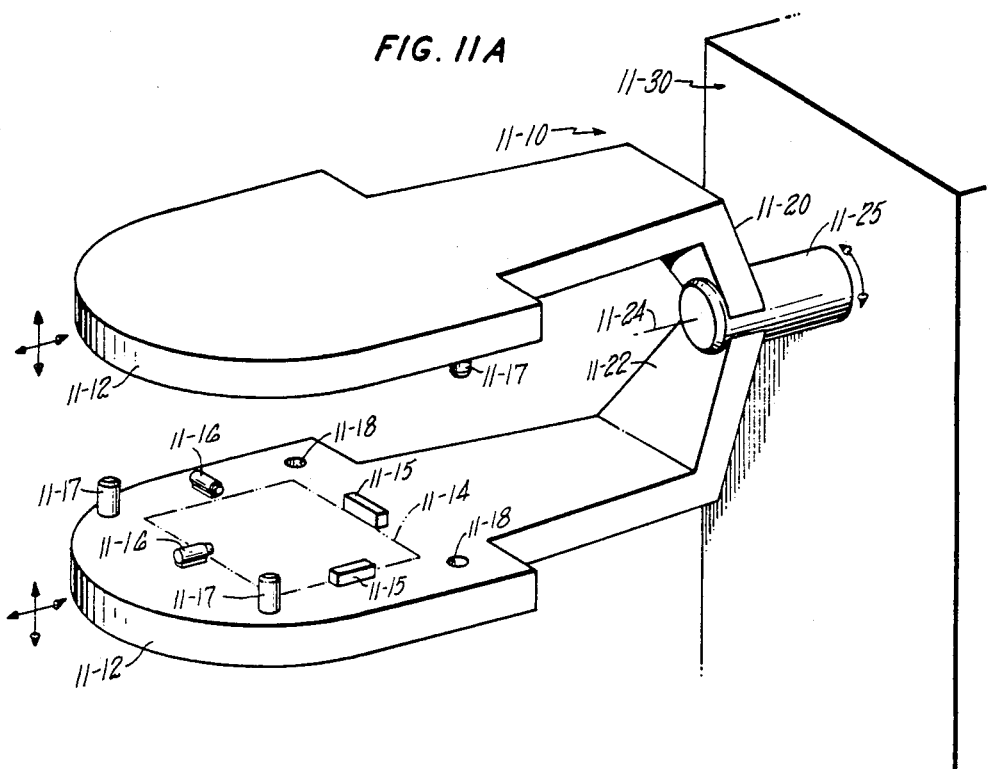
FIGS. 11A and 11B illustrate an alternative device for inverting dice.

A mass inversion step may be performed with the apparatus shown in FIG. 11A, in which two matching inversion plates 11-12 each hold a waffle pack 7-228. Only the lower plate 11-12 is shown, without the waffle pack, for greater clarity in exposition. Initially, a full waffle pack having dice with contacts facing down is placed in the dotted outline 11-14, aligned by stops 11-15 and held in place by compliant members 11-16, each of which is a spring loaded cylinder having a rounded tip. This mechanism is the same as that used in FIG. 7A and the robot gripper is the same.

The overall mechanism indicated by the numeral 11-10 includes holders 11-12 and conventional parallel-motion (parallelogram linkage) means 11-20, and 11-22, which are indicated schematically. These jaws move parallel to axis 11-24 of shaft 11-25 (activated by controller 11-30) from the open position shown in the figure to a closed position centered on the axis. The activating means may be a hydraulic cylinder or a motor. Alignment pins 11-17 and alignment holes 11-18 engage their opposites in the other inversion plate before the waffle packs mate. Optionally, the waffle packs may also have alignment pins for a fine alignment to compensate for position tolerance of members 11-15 - 11-16.

Once the inversion plates and waffle packs have engaged, assembly 11-10 rotates 180 degrees about axis 11-24 by turning shaft 11-25 under control of a rotating table within controller 11-30. The dice within the receptacles 7-225 of the filled waffle pack will have fallen into the empty one, aided by air pressure and vacuum lines carried within shaft 11-25. These lines will be switched by valves within controller 11-30 from an initial vacuum to hold the dice in the lower pack to a positive pressure to urge the dice into the other pack.

Figure 13A:
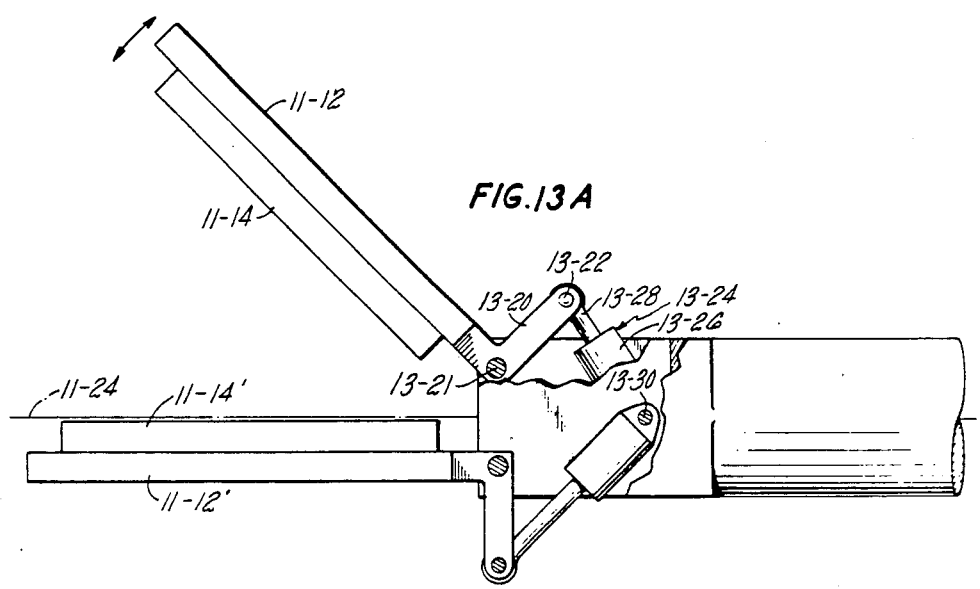
FIGS. 13A and 13B illustrate an alternate embodiment of part of the apparatus of FIG. 11.
Figure 13B:
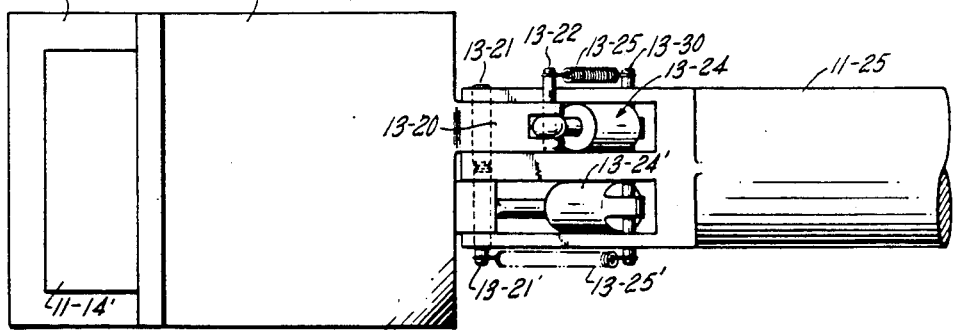

Alternatively, in order to avoid the possibility that a die will lean against one side of a receptacle in the waffle pack, the mechanism shown in cross section in FIG. 13B may be used, in which a portion of mating waffle packs 7-220 and 7-220' having apertures 7-225 with holes 7-224 further includes a frame 11-60 having pins 11-62 that pass through the apertures 7-224. Frame 11-60 is supported in the interior of plate 11-12 by means not shown. Pins 11-62 have top surfaces 11-70 that are wide enough to support chips 11-80. Before the rotation step, frame 11-60 is gently raised by air pressure, spring pressure or any convenient means to pass through holes 7-224 and then lift chips 11-80 almost to the bottom surfaces 11-90 of the receptacles 7-225 in mating waffle pack 7-220'. When the inversion step is performed, chips 11-80 will fall only a short distance, 0.05 inch say, so that the chips will be flat on surface 11-90 of receptacle 7-225.

In order to facilitate smooth operation, both waffle packs may be pivoted to compensate for mechanical misalignment, so that they mate properly. Gripper arms 11-52 pivoting about fixed pivots 11-50 terminate in gripping ends 11-54 that clamp the waffle pack 7-220'. Fixed pivots 11-50 are supported by a conventional means, such as a gymbal mount, not shown in the drawing for clarity. Movable pivot 11-55 joining both gripper arms 11-52 is moved by a hydraulic cylinder or other means as shown by the arrow to engage or disengage the waffle pack. A similar pivot may be used for waffle pack 7-220.

After the rotation, jaws 11-20 and 11-22 separate and the formerly empty pack containing dice with contacts facing up is removed, with the initially full pack remaining for the next inversion.

Those skilled in the art will readily be able to device different embodiments of the invention in the light of this disclosure. For example, the inverter of FIG. 8A might have 14 receptacles in parallel, extending parallel to axis 8-42, and spaced to match the leadframe spacing, so that only one inversion step per leadframe set of dice is needed. The receptacles on top of such an inverter would be filled and then the complete set would be inverted into the waffle pack. The four tubes 8-12 of FIG. 8A may be replaced by any convenient number spaced about the circumference of cylinder 8-40.

Figure 12:
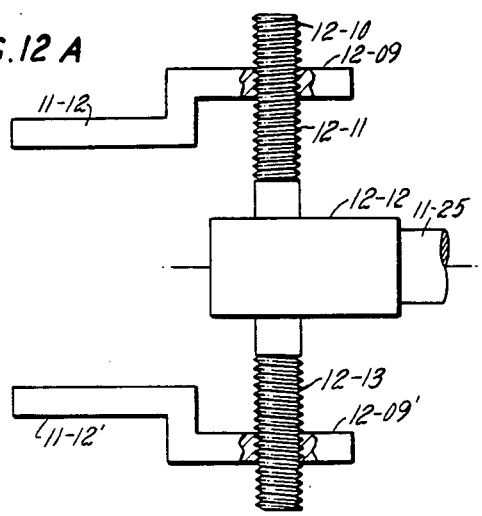
FIGS. 12A and 12B illustrate an alternate embodiment of part of the apparatus of FIG. 11.
Figure 12B:
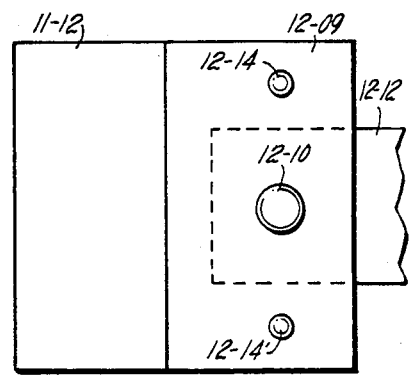

FIGS. 12 and 13 illustrates two alternative devices for performing the inversion step with a full waffle-pack. In FIGS. 12A and 12B, an alternative device to that shown in FIG. 11A uses the same controller 11-30 that rotates shaft 11-25, but in which the two holders 11-12 are supported in a different manner.

Referring now to FIG. 12A, two holders 11-12 and 11-12' are shown, which move in the directions indicated by the arrows vertically, without horizontal motion. The motion is supplied by shaft 12-10 having two areas 12-11, 12-13, which are threaded in opposite directions, respectively. These threads engage mating threads in threaded blocks 12-09 and 12-09' which are part of the supports for holders 11-12. As shaft 12-10 rotates in one direction holders 11-12 separate so that the waffle-pack may be inserted or removed. Box 12-12 is a schematic representation of a reversible electric motor together with a worm-gear drive for supplying the rotating force to shaft 12-10. Box 12-12 is shown supported by shaft 11-25 which rotates as described above. Electric power is supplied to box 12-12 through the hollow interior of shaft 11-25. In FIG. 14B, a top view of support 11-12 is shown, showing guides 12-14 and 12-14', which serve to maintain holders 11-12 and 11-12' in alignment.

Figure 11B:
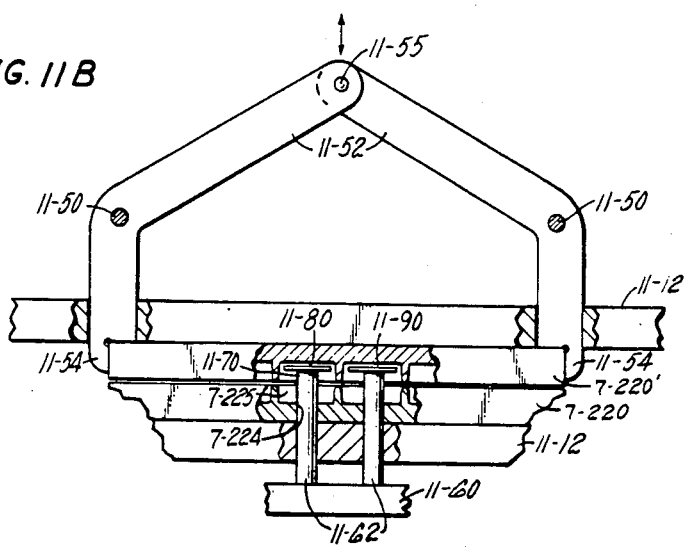

Referring now to FIGS. 13A and 13B, another alternative embodiment of the support and moving mechanism for holders 11-12 is shown. In this figure, only the upper plate has moved to provide clearance for insertion and removal of the waffle pack. Holder 11-12 is rotated about pivot 13-21. The rotating force is supplied by lever arm 13-20 connected by pivot 13-22 to cylinder assembly 13-24, comprising moving cylinder 13-28 and housing 13-26. Cylinder 13-24 pivots about pivot 13-30 that is aligned on axis 11-24. Lifting force is supplied by spring 13-25, which maintains holder 11-12 in a normally lifted position. When air pressure is applied to cylinder 13-28, it extends to expand spring 13-25 and force holder 11-12 down toward axis 11-24, to mate the two waffle packs. During the inversion step, the two plates 11-12 and 11-12' are maintained parallel with their respective waffle-packs 11-14 and 11-14' in alignment. At the end of the rotation step, the upper plate 11-12 is lifted, as indicated by the arrows, to permit the robot gripper arm to remove the bottom waffle pack. FIG. 15B shows a top view of this device. Cylinder 13-24 is the upper cylinder in this case and cylinder 13-24' is shown in a cutaway view. Air pressure for the two cylinders 13-24 and 13-24' is supplied along hoses passing through the interior of hollow shaft 11-25, as before. Controller 11-30 serves to open and close the holders and rotate the shaft, as described with respect to FIG. 11.

In all the embodiments that perform the inversion step with the waffle packs, there will be an additional pick and place step, shown as "Die Place" in FIG. 2, in which the upward-facing dice in holder 7-220' are removed and placed in a 14 chip holder, similar to 7-221, that has the chips positioned to align with a leadframe set for the bonding operation. This is a conventional pick and place operation, however, it is a parallel process operation in which one row of holder 9-220' is picked up simultaneously; placed in a preciser to secure the correct alignment; then placed in the bonding fixture with the correct alignment.

Figure 14:
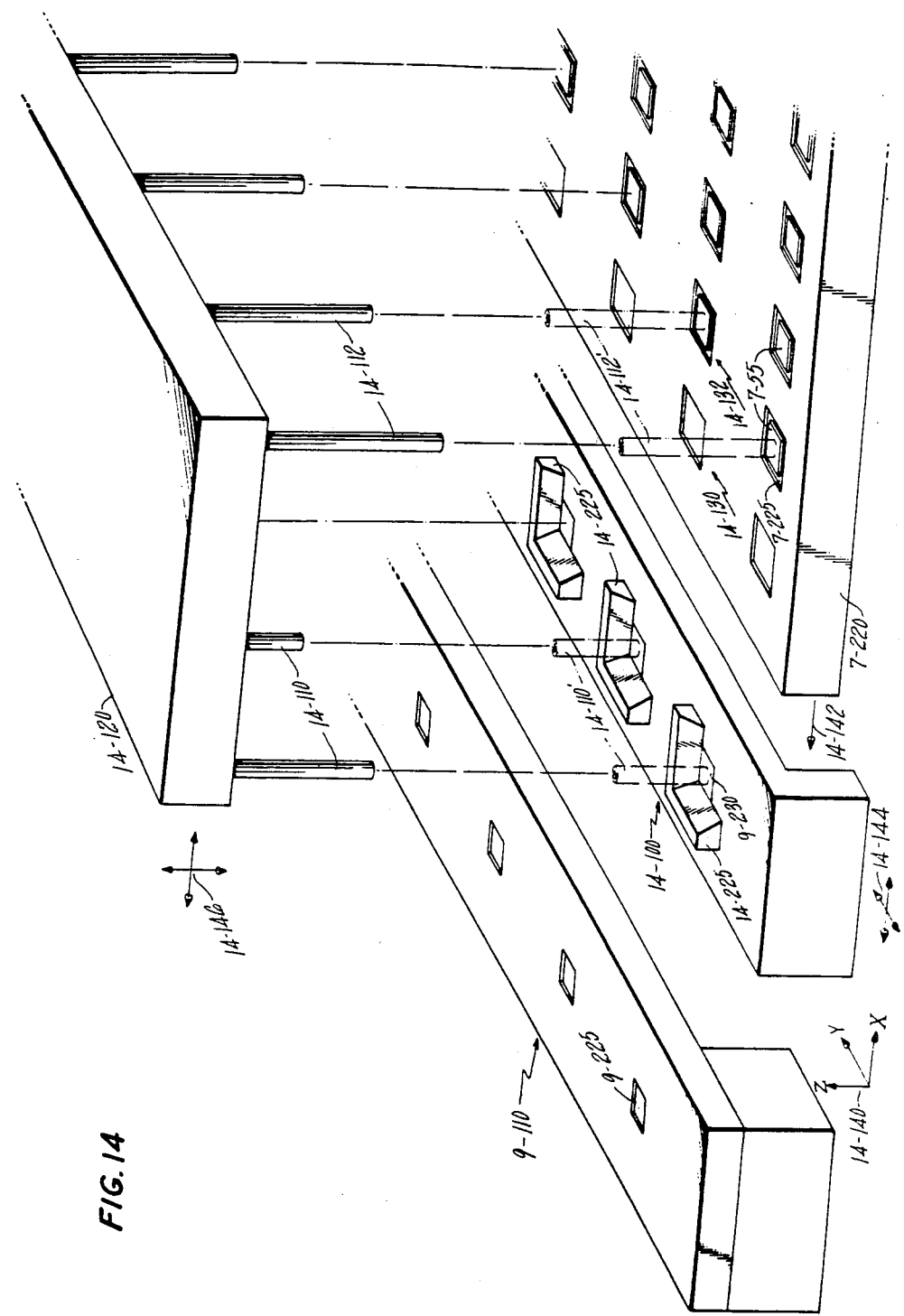
FIG. 14 illustrates a transfer apparatus for moving a set of dice in parallel.

Referring now to FIG. 14, there is shown a perspective view of a simplified transfer apparatus. FIG. 14 is an exploded view, in order to present the apparatus more clearly. Row 14-130 of waffle pack 7-220 (in this figure, a waffle pack having the spacing of the bonding fixture is used) is empty, having had its dice, indicated by the numerals 9-230, placed in preciser 14-100 by pick-up fixture 14-120. In the step illustrated, fixture 14-120 is about to pick up simultaneously row 14-132 of dice 7-55 in receptacles 7-225 of waffle pack 7-220 and the row of dice 9-230 in alignment fixtures 14-225 of preciser 14-100.

The dice will be held by vacuum to the tips of gripping probes 14-112 and 14-110, which vacuum is distributed by a conventional manifold in the interior of fixture 14-120. Two pairs of probe tips 14-110' and 14-112' are shown in contact with dice 7-55 and 9-230. The probes have conventional rubber or plastic tips in order to maintain the vacuum.

When the dice have been gripped, fixture 14-120 will be lifted along the Z-axis in 14-140 and translated to the left along the x-axis, so that probes 14-110 carrying aligned dice will be located above receptacles 9-225 in lower bonding fixture 9-110 and probes 14-112 carrying unaligned dice from row 14-132 will be located above preciser angles 14-225 in preciser 14-100. As a convention, the receptacles or alignment fixtures are referred to as -225, with the prefix on the identifying numeral indicating a drawing that shows further relevant information. Fixture 14-120 is to be lowered and the vacuum released, so that dice are simultaneously deposited in the bonding fixture and the preciser.

The function of preciser 14-100 is indicated by its name. The dice in waffle pack 7-220 are resting at random within oversized receptacles 7-225, which are made with a loose tolerance (typically ⅛ inches greater in length) to a facilitate fast transfer. Preciser 14-100 receives the dice and, by tapered surfaces on preciser angles 14-225, guides the dice into position at the corners with a typical tolerance of 0.002 inches that is sufficient to allow for reliable insertion into bonding fixture 9-110. In order to allow for tolerances in the position of dice 7-55, preciser 14-100 may be offset along the x and y axes, as indicated by arrows 14-144, to ensure that all dice make contact with the tapered sides. If that is done, then fixture 9-110 will also be offset to match the spacing of probes 14-110 and 14-112. Preciser 14-100 may also be moved to positions that will accept different size dice as shown by arrows 14-144. If the preciser is to operate with standard dice, then rectangles may be used instead of preciser angles 14-225.

In the embodiment illustrated, waffle pack 7-220 has several rows of dice, 14-132 being the curent row. The waffle pack has slid below preciser 14-100 in order to present row 14-132 at the correct position. As a consequence, fixture 14-120 must have probes 14-110 and 14-112 offset vertically by an amount that will allow clearance below preciser 14-100 for waffle pack 7-220. Also, fixture 9-110 will have to be positioned with respect to preciser 14-100 by the same vertical and horizontal displacement as that between waffle pack 7-220 and preciser 14-100, in order to receive the dice. Supporting members and mechanisms for translating the waffle pack, preciser, bonding fixture and pickup fixture are omitted from the drawing in order to represent the essential spatial relationship of the apparatus with the greatest clarity. Those skilled in the art will readily be able to add any of a number of one or two dimensional drives to effect the motion. Illustratively, waffle pack 7-220 and bonding fixture 9-110 may be placed and removed by the same general purpose robot having a conventional gripper. Pickup fixture 14-120 may be moved by a dedicated two-dimensional translator.

Bond

Figure 9:
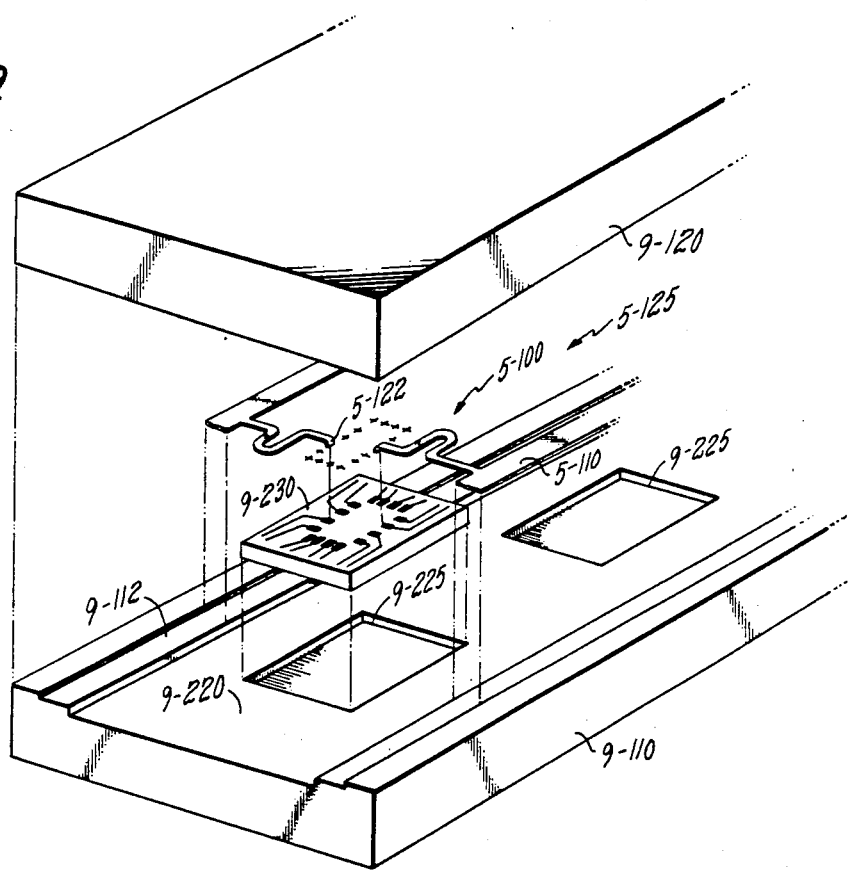
FIG. 9 illustrates a carrier used to hold a leadframe and die during the bonding step.

The assembly for the final bonding step (Step V in FIG. 1 and Leadframe Fixture Assemble, Bond, Disassemble in FIG. 2) is shown in an exploded view in FIG. 9, in which holder 9-110, represented schematically, holds 14 chips with the correct spacing, only two of the receptacles 9-225 being shown. Above receptacle 9-225, there is positioned chip 9-230 and, above the chip, a set of finger contacts 5-122 in leadframe 5-100, part of leadframe strip 5-125. The details of the leadframe will be described below. Cover 9-120 presses down on edge 5-110 of leadframe strip 5-125, which edges rest on shelves 9-112 to position the outer parts of the strip so that the counter tips will be deflected slightly. This deflection is done to compensate for inevitable fluctuations in the position of the tips during the manufacturing process, so that reliable contact is ensured during the bonding operation. The deflection is effected by making the depth of receptacle 9-225 such that the top of chip 9-230 projects above the plane of shelves 9-112 by a set amount. The amount of deflection, 0.005 inch to 0.007 inch) is illustratively several standard deviations of the nominal fluctuation of the tip position to ensure reliable joint formation. The edges 5-110 of leadframe strip 5-125 will be forced on to shelves 9-112 by cover 9-120 and tips 5-122 will thus be pressed against the pads by the spring constant of the leads.

Figure 5:
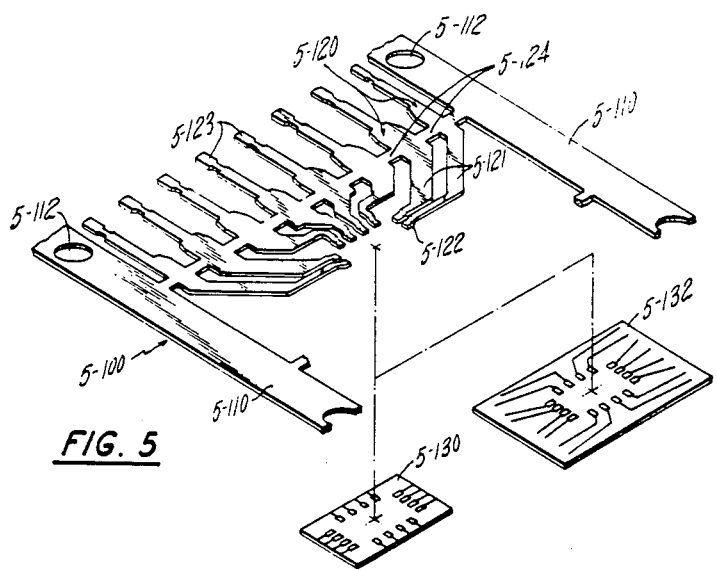
FIG. 5 illustrates a portion of a leadframe.

A typical leadframe used in the invention is illustrated in FIG. 5, in which half of an individual frame is shown. The individual leadframes are stamped out of a ribbon of metal that may be an inexpensive copper alloy, in contrast to the expensive alloy having the correct thermal properties that is used in the standard prior art process. Strips 5-110 on either side of the ribbon serve to carry the actual leads 5-120 along. Leads 5-120 have an exterior end 5-123, shaped either for insertion in a socket or for surface-mounting, and an interior portion 5-121 for attachment to a die. The two portions are joined by segments 5-124 that will be severed after the bonding step. Holes 5-112 are provided to give a reference in positioning the leadframe. At the end of each lead segment 5-121, there is a region, 5-122, in which the lead is bent in a quarter circle (or bent twice to form a parallel contact section) to form a standard dimension flat contact area. Each of the different lead segments 5-121, with its different length, has been shaped to provide substantially the same spring constant so that the contact areas 5-122 will be uniformly pressed against the mating pads on the die to give correct alignment for the soldering operation. The leads 5-120 have been tinned with solder in a previous step in the fabrication of the leadframe ribbon.

It is an advantageous feature of the system, but not an essential one, that a family of chips that have the same number of pins have the same standard pad array on top of the dielectric. For illustration, two dice 5-130 and 5-132 of different size are shown together with the leadframe. With this feature, it will then be necessary to have only one ribbon of leadframes for the entire family of chips, with substantial savings in inventory.

Both the contact pads 342 of the die and the tips 5-122 have been tinned and are ready to be heated. The bonding is done by a vapor phase reflow soldering technique or other means of heating the materials to reflow the fusible alloys. These alternative techniques include infra-red heating, conveyor ovens, hot gas heating or laser heating. In vapor phase reflow, a liquid such as Flourinert FC-71 is maintained at its boiling point, the liquid having been selected so that its boiling point is above the soldering temperature. The soldering assembly of holders 9-110 and 9-120, with chips plus leadframe maintained in alignment, is inserted into a container or oven that is filled with the vapor at the boiling-point temperature and held there until the solder has melted and flowed to form a bond. A typical length of time for the heating cycle is 5 to 15 seconds. This boiling point temperature is typically above 225 degrees C. but below 300 degrees C. In contrast, the present wire bonding and die attach steps are performed at temperatures of up to 460 degrees C. and performed individually. In order to reduce the length of the heating cycle, the bonding fixture should have low mass and many apertures to permit the vapor to flow freely about the solder joints. Holders 9-110 and 9-120 have been shown schematically in order to reduce the complexity of the drawing.

An important economic benefit of this invention is that all the leads are soldered at the same time. This is in contrast to the wire-bonding technique, in which the leads must be bonded one by one. The soldering step takes no longer for a 28 pin chip than it does for a 16 pin chip.

Machine Layout

Figure 10:
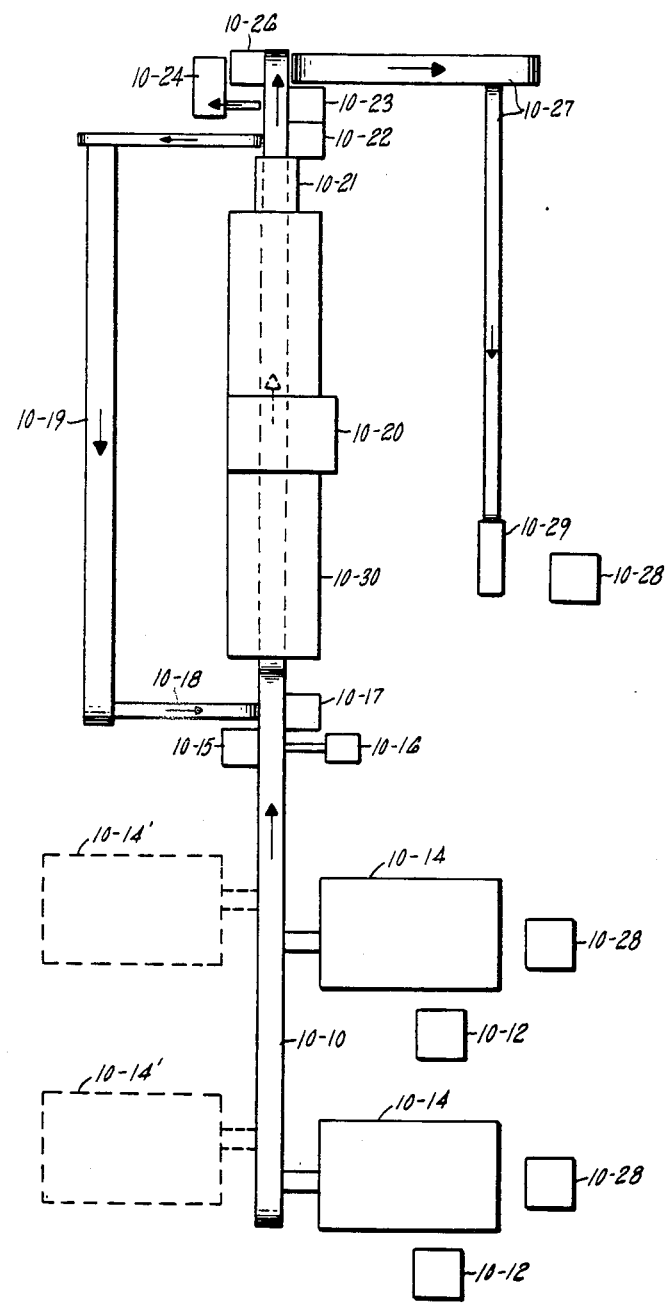
FIG. 10 illustrates a layout for machines used in automatic die to leadframe attachment.

FIG. 10 shows, in partially schematic, partially pictorial form, the portion of the method that takes the array of dice from the sawn wafer and produces a leadframe with dice soldered to it (Steps IV and V in FIG. I).

Figure 8C:
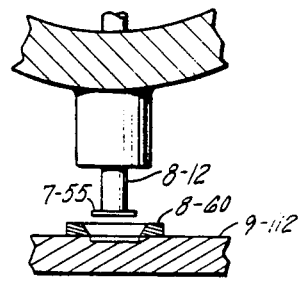

Box 10-12 is a schematic representation of a cassette or rack containing a number of tape frames 430 that have passed through the sawing operation and perhaps the optional inspection step. Box 10-28 is a schematic representation of a cart or other holder that keeps a supply of lower bonding fixtures 9-110. Box 10-14 is a schematic representation of an assemblage of devices including a bar code reading station 7-10, at least one pick down station 7-100 (FIG. 7) and at least one robot such as a Seiko RT-3000 that performs material handling steps such as moving film frames from one station to another; inverting the dice in waffle pack 7-220 (FIGS. 11, 12, 13); transferring the dice from inverted waffle pack 7-220' to bonding fixture 9-110 (FIG. 14); and placing the filled fixture 9-110 on conveyor 10-10. In a preferred embodiment, the work station includes one robot having a gripper adapted for handling the waffle packs and tape frames; two pick-down stations, one inversion station and one bar code reader. A second robot with a specialized vacuum pick-up transfers the inverted dice from a waffle pack to a "preciser", which is a fixture that aligns the corners of the dice to the correct tolerance. If only a single corner is aligned, the preciser may be used with dice of different sizes. If the dice are inverted sequentially then, as shown in FIG. 8, the inversion device will be located in pick-down station 7-100 and the mass transfer device of FIG. 14 will not be used.

In FIG. 10, conveyor 10-10 receives lower bond fixture 9-110 from the transfer station of FIG. 14 and moves it to a series of stations in which a leadframe strip is placed above the die and upper bodn fixture 9-120 is placed above the leadframe assembly.

Four work stations 10-14 are shown. The number actually used in any situation may vary, of course, depending on the throughput that can be handled by the bonding stage, or whatever the particular limiting factor may be.

Box 10-16 is a schematic representation of a leadframe input station that holds an accumulation of leadframes and presents them to robot 10-15, illustratively a Seiko PN-100, that places a 12-chip leadframe above the dice in lower bond fixture 9-120. Unit 10-16 may be simply a magazine of precut leadframe strips or it may be a roll of leadframes with a cutting mechanism. In the magazine embodiment, a magazine is sequentially raised to an input level, and the precut strips are ejected by an air blast.

Handling the leadframes presents a difficult challenge. They are fragile and would easily be crushed by conventional grippers. Grippers with "tactile" sensors might be used, but they are expensive. Vacuum lifters cannot be used because of the many apertures in the leadframe.

Figure 15A:
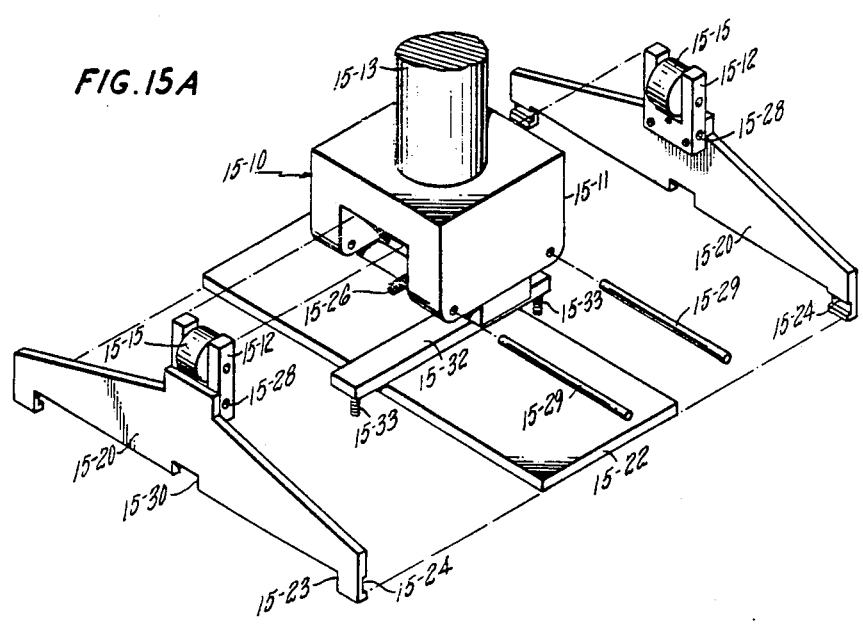
FIGS. 15A and 15B illustrate a gripper mechanism for the leadframes.
Figure 15B:
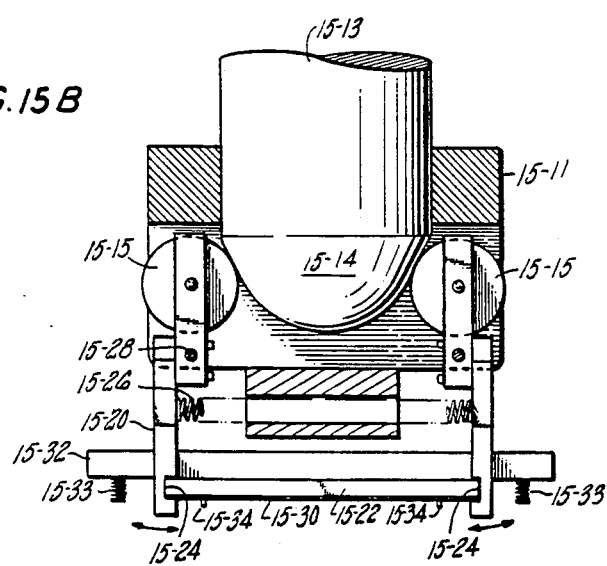

FIGS. 15A and 15B illustrate an economical gripping fixture that handles the task of lifting and aligning the leadframe. FIG. 15A is an exploded view and FIG. 15B is a side view of an assembled fixture. Referring now to FIG. 15B, the principle that has been adopted is the use of a "back-up bar" 15-22 to relieve the pressure that gripping fixtures 15-20 would otherwise exert. The force arises from spring 15-26, shown as connected between grippers 15-20 and pulling them together. Other springs in different locations or other methods of exerting force may also be used.

Leadframe 15-30 is located below bar 15-22 and between notches 15-24 in extensions 15-23 of gripping fixtures 15-20. As can be seen in FIG. 17A, there are four notches 15-24. There is a nominal clearance of 0.015 inch between the bottom of bar 15-22 and the bottom of notch 15-24. Since leadframe 15-30 is only 0.010 inch thick, there is a margin of 0.005 inch.

Gripping fixtures 15-20 pivot about pivots 15-29 in response to downward pressure from cone 15-14 on rollers 15-15 attached to fixtures 15-20. Cone 15-14 is illustratively part of a commercially available air actuated cylinder with spring return, 15-10, available from the Seiko corporation. Housing 15-11 encloses cylinder 15-13, having cone 15-14 on the lower end, and provides support for pivots 15-29 through hole ends 15-28 on arms 15-12. There are four hole ends 15-28 that support both ends of each pivot 15-29. Housing 15-11 also supports bar 15-22 through a rigid support that is omitted from FIG. 17 for clarity. The motion of gripping fixture 15-20 is indicated by the arrows in FIG. 15B.

Slots 15-30 in fixtures 15-20, visible in FIG. 15A, provide clearance for spring-loaded plungers 15-33, shown schematically in the figures, as being supported by support bar 15-32 fastened to backup bar 15-22. The function of plungers 15-33 is to press against lower bond fixture 9-112 to prevent backup bar 15-22 from being held by its alignment pins to the bonding fixture.

Two alignment pins, 15-34, are shown in FIG. 17B. Pins 15-34 are located on diagonally opposite corners of bar 15-22 in order to locate bonding fixture 9-112 with respect to bar 15-22. This alignment does not align the leadframe with respect to the bonding fixture or with the dice because the holes in the leadframe through which pins 15-34 pass are oversized. That alignment is effected by pins in the bonding fixture, not shown in the drawing, that enter selected holes in the leadframe. The bonding fixture, leadframe and gripper combination must be within a tolerance range before the alignment pins in the bonding fixture will enter the proper holes in the leadframe, of course, and that is the function of pins 15-34. There will always be errors in the exact location of pins and holes and pins 15-34 may bind in their mating holes. Plungers 15-33 are used to ensure disengagement of pins 15-34 from the bonding fixture. Leadframe 15-30 remains with the bonding fixture because the holes in the leadframe through which pins 15-34 pass have a looser tolerance than the four holes that mate with alignment pins in the bonding fixture. The combination of four pins and tighter tolerance ensures that leadframe 15-30 is held fast when the gripper is lifted.

Returning now to FIG. 10, rotor 10-17, illustratively another Seiko PN-100, picks an upper bond fixture 9-120 from accumulator 10-18 (illustratively a Dorner Corporation Series 4100) that is the end of a return loop that will be discussed further below. Upper fixture 9-120 is placed above the leadframe to press it down for good bonding contact as described above. Illustratively, magnetic attraction between magnets and magnetic material in the upper and lower fixtures is used to maintain the bonding fixture in correct alignment during the bonding process.

The completed bonding fixture is placed on a second conveyor 10-30 that is part of an HTC Corporation IL-12 vapor phase heating system using Fluorinert FC-71 as a heat transfer medium. The bonding fixture passes through the system at a rate of speed that is adjusted to provide adequate heating for reliable bonding, typically spending 5–15 seconds within the vapor zone.

The bonded assembly passes to cooling station 10-21, where it rests in thermal contact with a chilled plate for a period of 30–35 seconds. The time and cooling are set to allow the solder to solidify and to allow the chip plus leadframe to reach a temperature below the reflow temperature and at which it can be handled.

The bonding fixture is then disassembled, with upper fixture 9-120 being removed by Seiko PN-100 robot 10-22 and placed on conveyor 10-19 (Dorner Corporation, Series 5000) for return to accumulator 10-18. Another robot 10-23 (another Seiko PN-100), using the gripper fixture shown in FIG. 14, removes the bonded leadframe/dice combination and places it in magazine 10-24, a forty position 0.1 inch pitch magazine used for transport to the next station. Lower fixture 9-110 is transferred by robot 10-26 (another Seiko PN-100) to conveyor 10-27 (another Dorner Corporation, 5100 Series) for transfer to accumulation station 10-29 and subsequent transfer to cart 10-28 for return to station 10-14.

Those skilled in the art will readily be able to devise other embodiments of the invention than that described and illustrated above and the scope of the appended claims is not meant to be confined to the illustrative embodiment.

The invention may be applied in systems other than that described above. In particular, the invention may be employed with different methods for lead attachment, such as wire-bonding or sequential soldering or adhesive attachment. The invention also may be employed with integrated circuits that do not have the standard contact pad array described above.

We claim:

1. An apparatus for removing selected integrated circuit dice from an array of noncontiguous dice adhesively attached to a support member having an upper striking side and a lower adhesive side to which bottom sides of said dice are attached, said dice further having a contact side opposite said bottom side, comprising:

> striking means, positioned above said support member, for striking downward on said support member to dislodge dice therebelow; translation means for moving one of said support member and said striking means in a horizontal plane so that a striking member in said striking means is positioned above a selected die in said array of dice wherein said striking member comprises at least one needle member for perforating said support member and striking a die adhesively attached therebelow and means for driving said needle member downward; and wherein said at least one needle member comprises four needle members positioned in a rectangular array, together with a fifth spring-loaded needle member positioned within said rectangular array and extending a predetermined distance below the others of said needle members.

2. An apparatus according to claim 1, in which said at least one needle member is enclosed within a striking member housing having a rounded lower surface; and in which said striking means is positioned such that said rounded lower surface presses downwardly on said support member.

3. An apparatus for removing selected integrated circuit dice from an array of noncontiguous dice adhesively attached to a support member, said support member having an upper striking side and a lower adhesive side to which bottom sides of said dice are attached, said dice further having a contact side opposite said bottom side, the apparatus comprising: striking means, positioned above said support member, for striking downward on and penetrating said support member to dislodge dice therebelow; and translation means for moving one of said support member and said striking means in a horizontal plane so that a striking member in said striking means is positioned above a selected die in said array of dice; wherein said striking member comprises at least one needle member for perforating said support member and striking a die adhesively attached therebelow and means for driving said needle member downward; and wherein said at least one needle member comprises four needle members positioned in a rectangular array, together with a fifth spring-loaded needle member positioned within said rectangular array and extending a predetermined distance below the others of said needle members; and > plate means for receiving said dislodged dice from said striking means; and means for displacing said plate means.

4. The apparatus of claim 3 wherein said means for displacing said plate means comprises means for rotably displacing said plate means.

5. An apparatus according to claim 3, in which said at least one needle member is enclosed within a striking member housing having a rounded lower surface; and in which said striking means is positioned such that said rounded lower surface presses downward on said support member.

* * * * *